US006257934B1

(12) United States Patent
Gong et al.

(10) Patent No.: US 6,257,934 B1
(45) Date of Patent: Jul. 10, 2001

(54) AUDIO JACK ELECTRICAL CONNECTOR

(75) Inventors: Liang Gong; Guang-Xing Shi; Xue-Dong Ma, all of Kun-San (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/374,647

(22) Filed: Aug. 16, 1999

(30) Foreign Application Priority Data

May 18, 1999 (TW) ........................................ 88207963

(51) Int. Cl.[7] ........................................ H10R 24/04
(52) U.S. Cl. ........................................ 439/668; 439/358
(58) Field of Search ........................................ 439/668, 682, 439/79, 80, 83, 581, 357, 358, 188, 354, 58, 67, 70

(56) References Cited

U.S. PATENT DOCUMENTS 3,795,885 * 3/1974 Desso et al. .................... 439/67
4,392,708 * 7/1983 Bailey et al. .................... 439/668
4,398,784 * 8/1983 Takihara .................... 439/668
5,338,215 * 8/1994 Lee et al. .................... 439/188
5,389,006 * 2/1995 Noschese .................... 439/354
6,068,509 * 5/2000 Lin .................... 439/541.5

* cited by examiner

*Primary Examiner*—Tulsidas Patel
*Assistant Examiner*—Son V. Nguyen
(74) *Attorney, Agent, or Firm*—Wei Te Chung

(57) ABSTRACT

An audio jack electrical connector comprises a body retaining a plurality of signal terminals and a spacer defining a plurality of receiving holes for retaining connection contacts. The signal terminals extend beyond a bottom surface of the body for engaging with the corresponding connection contacts of the spacer. A tubular receptacle is defined through the body, and a projection portion of the receptacle is formed on a front surface of the body for engaging with a plug for audio signal transmission. A pair of locking elements is formed on lateral edges of the body. Each locking element comprises a locking arm and a locking tip. A pair of locking portions is formed on lateral faces of the spacer. Each locking portion comprises a recess and a locking block. In assembly, the locking arm is received in the corresponding recess and the locking tip engages the locking block. Thus, the body is securely assembled to the spacer.

10 Claims, 7 Drawing Sheets

AUDIO JACK ELECTRICAL CONNECTOR

BACKGROUND OF THE INVENTION

The present invention relates to an audio jack electrical connector, and particularly to an audio jack electrical connector having a spacer for adjusting the height of the audio jack electrical connector.

With the development of the multimedia computer, audio jack electrical connectors are widely used. Taiwan Patent Application Nos. 82207507; 84215349; 85206217; 85218465 and 86201643 each disclose a conventional audio jack electrical connector comprising a body and a plurality of signal terminals received in the body. A tubular receptacle extends from a front surface of the body for engaging with a plug. Generally, a conventional audio jack electrical connector used for a notebook computer is thicker than other common audio jack electrical connectors. Therefore, the body and the signal terminals must be changed, and the molds used for forming the body and the signal terminals must be accordingly adapted resulting in high production costs.

Thus, a spacer is needed to adjust the thickness of the conventional audio jack electrical connector for reducing the production costs.

BRIEF SUMMARY OF THE INVENTION

A main object of the present invention is to provide an audio jack electrical connector having a spacer for adjusting the thickness of the audio jack connector and reducing production costs of manufacturing an audio jack electrical connector having a different thickness.

To fulfill the above-mentioned object, according to a preferred embodiment of present invention, an audio jack electrical connector comprises a body retaining a plurality of signal terminals and a spacer defining a plurality of receiving holes for retaining connection contacts. The signal terminals extend beyond a bottom surface of the body for engaging with the corresponding connection contacts of the spacer. A tubular receptacle is defined through the body, and a projection portion of the receptacle is formed on a front surface of the body for engaging with a plug for audio signal transmission. A pair of locking elements is formed on lateral edges of the body, and each locking element comprises a locking arm and a locking tip. A base of the spacer comprises a top surface and a bottom surface. A pair of posts is formed on the bottom surface for securely positioning the spacer on a circuit board. A pair of locking portions is formed on lateral faces of the base. Each locking portion comprises a recess and a locking block. In assembly, the locking arm is received in the recess and the locking tip engages the locking block. Thus, the body is securely assembled to the spacer.

Other objects, advantages and novel features of the invention will become more apparent from the following detailed description when taken in conjunction with the accompanying drawings.

DETAILED DESCRIPTION OF THE INVENTION

Figure 1:
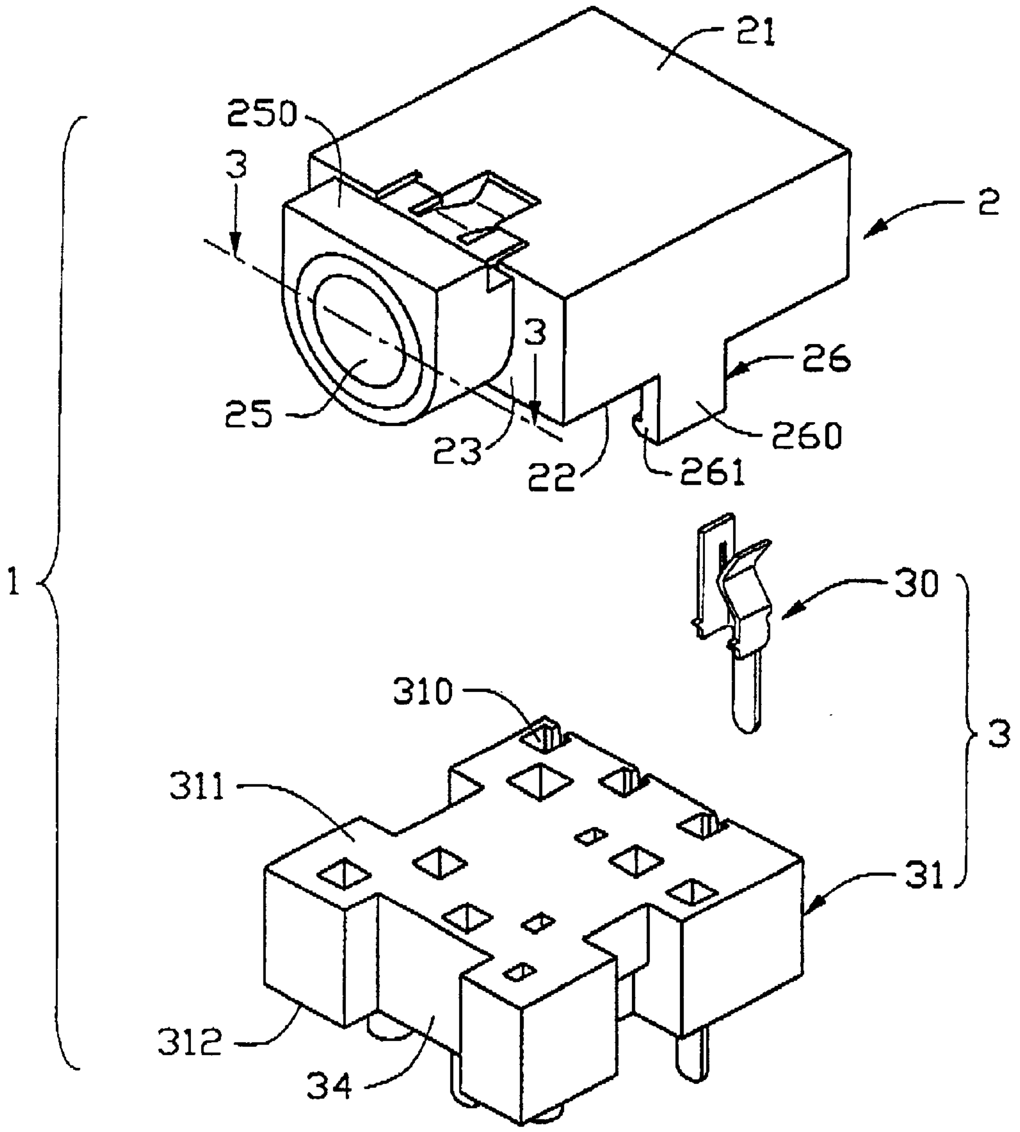
FIG. 1 is an exploded view of an audio jack electrical connector in accordance with the present invention.
Figure 2:
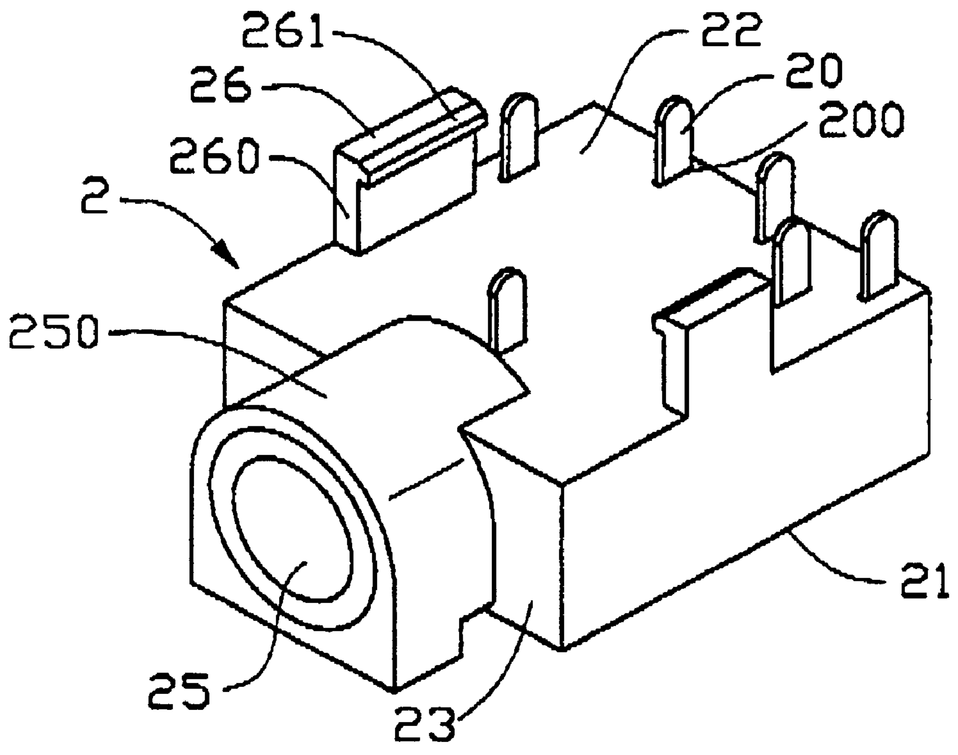
FIG. 2 is a perspective, bottom view of a body of the audio jack electrical connector.

Referring to FIGS. 1 and 2, an audio jack electrical connector 1 comprises a body 2 retaining six signal terminals 20 therein and a spacer 3 having a base 31 defining a plurality of receiving holes 310 for receiving corresponding connection contacts 30 and the signal terminals 20 therein. The body 2 comprises a top surface 21 and a bottom surface 22. Six passageways 200 are formed in the body 2 for receiving the corresponding signal terminals 20 therein. The signal terminals 20 extend beyond the bottom surface 22 of the body 2 for insertion in the corresponding receiving holes 310 of the spacer 3. A tubular receptacle 25 is defined through the body 2, and a projection portion 250 of the receptacle 25 is formed on a front surface 23 of the body 2 for engaging with a plug (not shown) for audio signal transmission.

Figure 3:
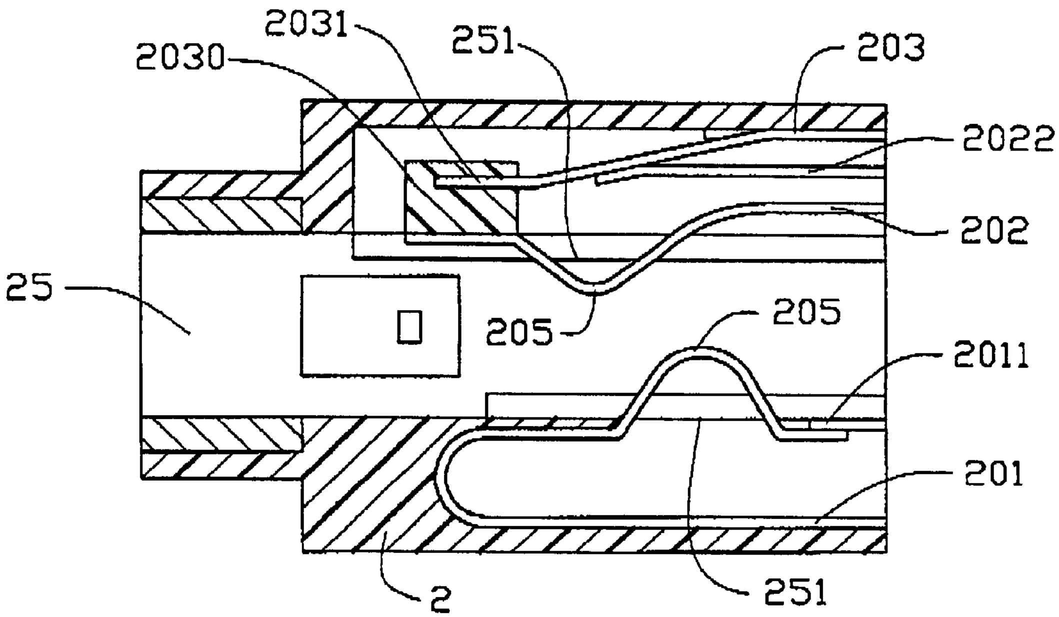
FIG. 3 is a cross-sectional view taken along line 3—3 of FIG. 1.
Figure 4:
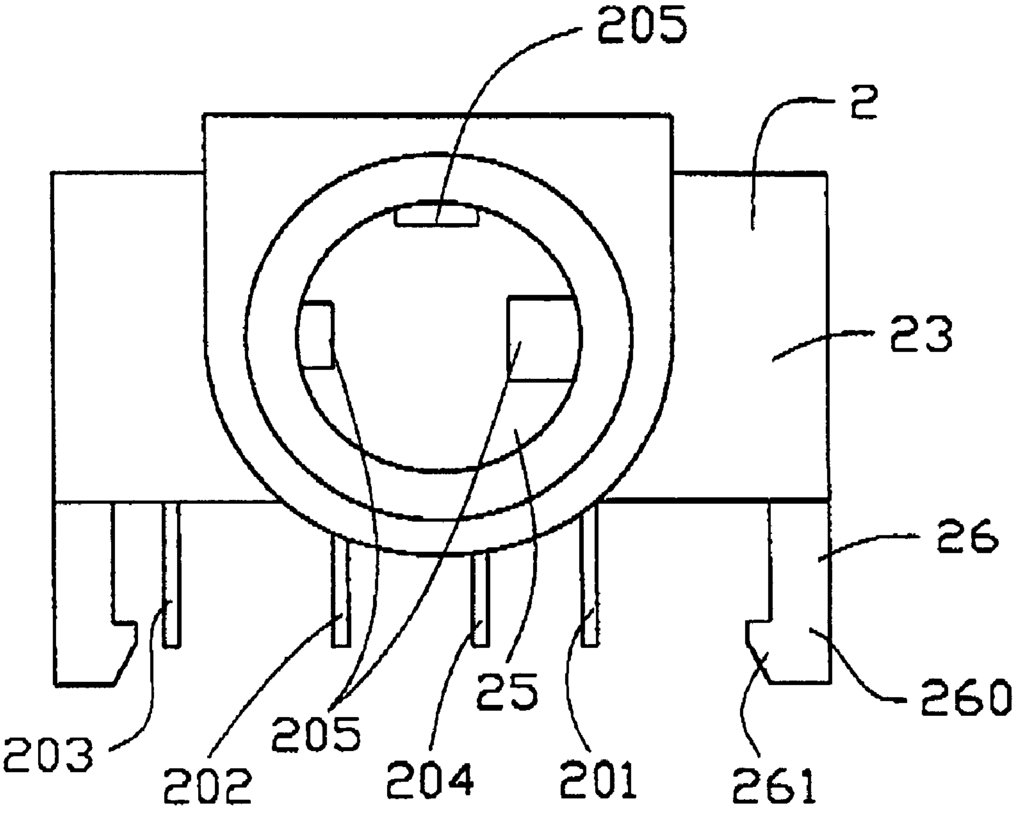
FIG. 4 is a front view of the body.

Referring to FIGS. 3 and 4, a receiving portion 251 is formed on an inner surface of the receptacle 25 for receiving the corresponding signal terminals 20 to electrically contact the plug. The passageways 200 are unsymmetrically formed in the body 2. A pair of locking elements 26 is formed on lateral edges of the body 2. Each locking element 26 comprises a locking arm 260 and a locking tip 261. The signal terminals 20 comprise first and second movable terminals 201, 202, first and second fixing terminals 2011, 2022, a third movable terminal 203 and a third fixing terminal 204. An end portion of each terminal 201, 202, 203, 204, 2011, 2022 is received in the body 2, and the other end extends beyond the bottom surface 22 for electrically contacting the corresponding contacts 30 of the spacer 3. The first and second movable terminals 201, 202 and the third fixing terminal 204 each have a resilient portion forming a contacting arm 205. An end portion 2031 of the third movable terminal 203 is secured in an insulative block 2030.

Before the audio jack electrical connector 1 engages with a plug, the first movable terminal 201 electrically contacts the first fixing terminal 2011, and the second fixing terminal 2022 contacts the third movable terminal 203. The second movable terminal 202 connects with the insulative block 2030. After the audio jack electrical connector 1 engages with the plug, the contacting arm 205 of the first and second movable terminals 201, 202 and the third fixing terminal 204 electrically contact corresponding parts of the plug. Therefore, the first movable terminal 201 separates from the first fixing terminal 2011, and the third movable terminal 203 separates from the second fixing terminal 2022. Thus, electrical signals can be transmitted between the plug and the audio jack 1.

Figure 5:
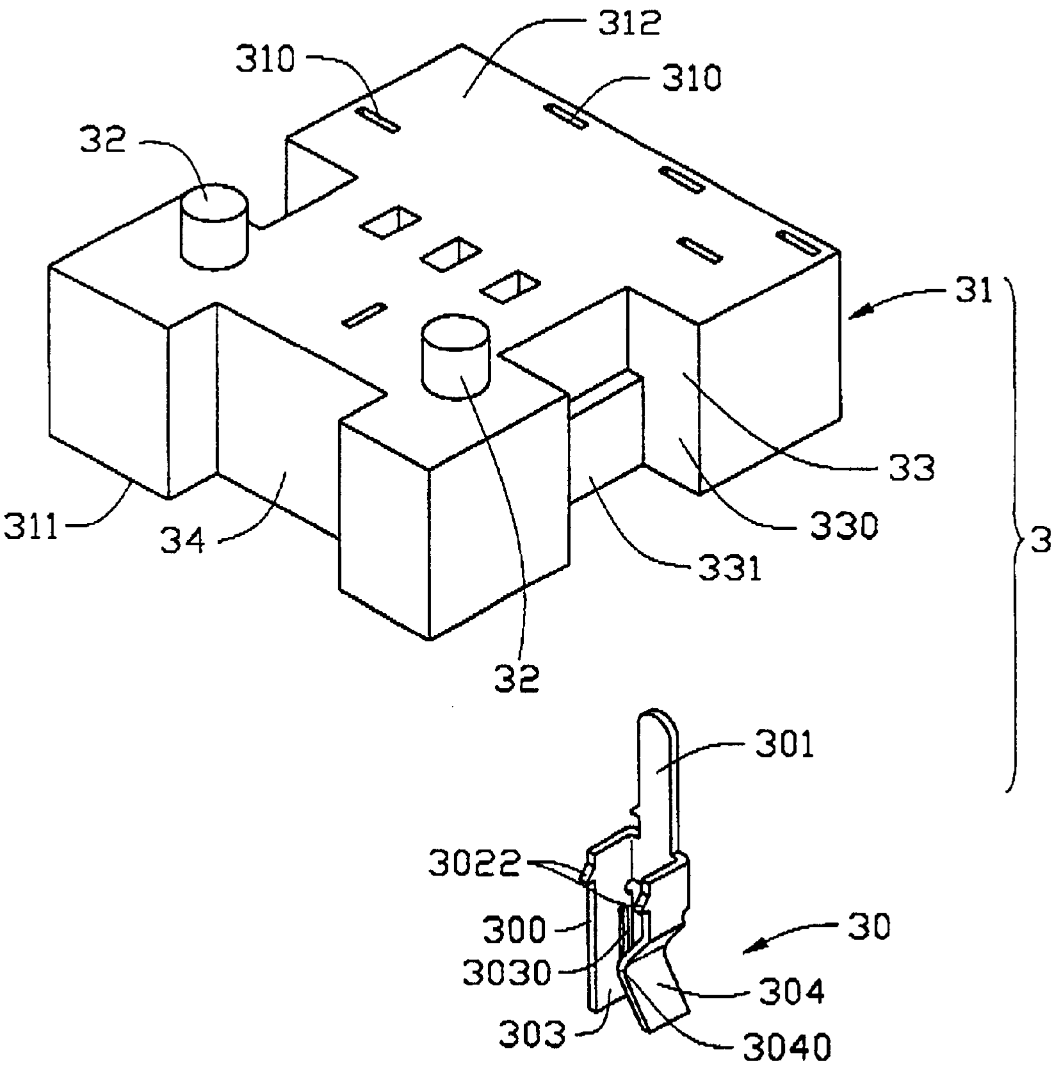
FIG. 5 is a perspective view of a spacer of the audio jack electrical connector.

Referring to FIGS. 1 and 5, the base 31 of the spacer 3 comprises a top surface 312 and a bottom surface 311. The connection contacts 30 retained in the receiving holes 310 electrically contact the corresponding signal terminals 20 for signal transmission. A pair of posts 32 extends from the bottom surface 312 for securely positioning the base 31 on a circuit board (not shown). A pair of locking portions 33 is formed on lateral faces of the base 31. Each locking portion 33 comprises a recess 330 and a locking block 331 extending into the recess 330. In assembly, the locking arm 260 of the body 2 is received in the corresponding recess 330 and the locking tip 261 engages with the locking block 331. Thus, the body 2 is securely assembled to the spacer 3. A groove 34 is formed in a front portion of the spacer 31 for receiving the projection portion 250 of the receptacle 25.

The connection contacts 30 are formed by stamping a metal plate. Each connection contact 30 comprises a contacting portion 300 and a insertion portion 301. The contacting portion 300 further comprises a fixing arm 303 and a resilient arm 304 formed on opposite edges thereof A pair of barbs 3022 is formed on the contacting portion 300 for securing the connection contact 30 in the base 31. A folded plate 3030 is bent from the fixing portion 303 and the resilient arm 304 forms a convex portion 3040 for providing reliable electrical connection with the corresponding signal terminal 20.

Figure 6:
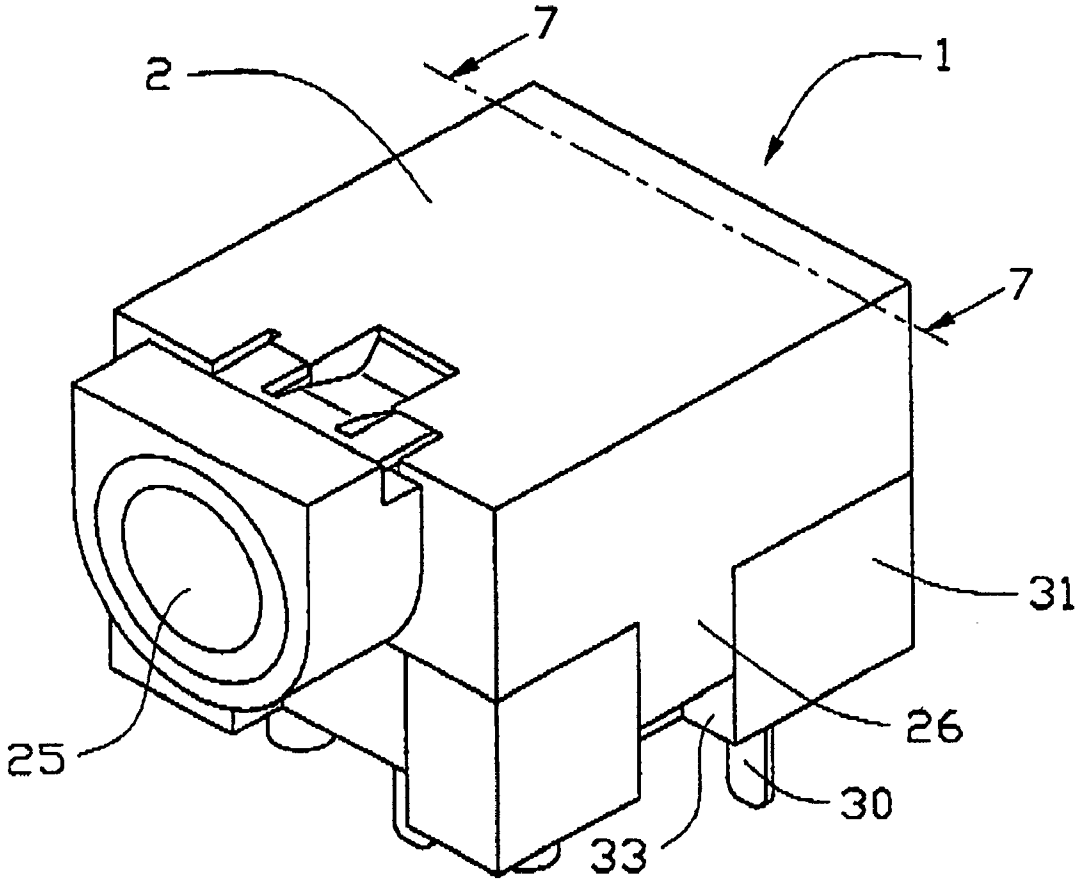
FIG. 6 is a perspective view of the assembled audio jack electrical connector.
Figure 7:
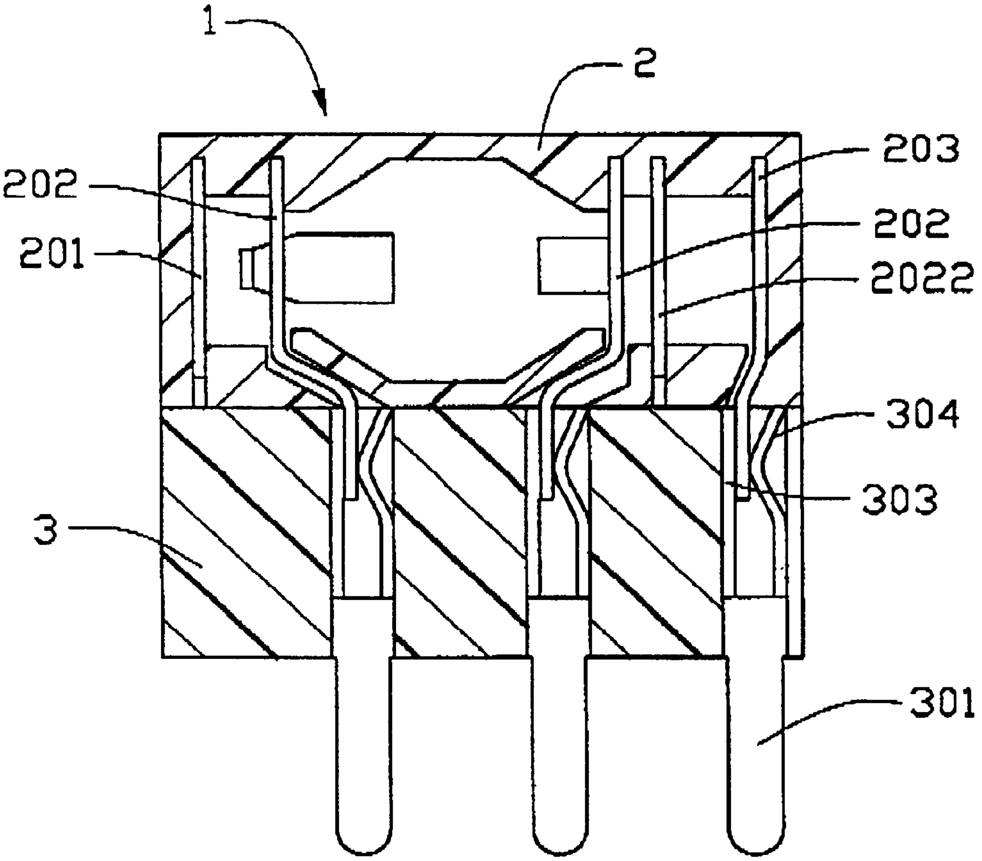
FIG. 7 is a cross-sectional view taken along line 7—7 of FIG. 6.

Referring to FIGS. 6 and 7, in assembly the connection contacts 30 are received in the corresponding receiving holes 310 of the base 31, and an end portion of the signal terminal 203 is snugly received between the fixing arm 303 and the resilient arm 304 thereby electrically contacting therewith each other. The locking arm 260 of the locking element 26 is received in the recess 330 and the locking tip 261 engages the locking block 331. Thus, the body 2 is securely assembled to the spacer 3. The spacer 3 can be suitably formed to provide the audio jack electrical connector 1 with a required height. Thus, productions cost are reduced by eliminating the necessity of manufacturing another audio jack electrical connector.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An audio jack electrical connector adapted for mating with an external plug, comprising:

a body having a plurality of passageways, a pair of locking elements extending from lateral edges of the body, and a tubular receptacle formed in the body for engaging with the external plug, a length of the tubular receptacle projecting forwardly from the body;

a plurality of signal terminals being received in corresponding passageways of the body, each signal terminal forming a contacting portion adapted for electrically engaging with the external plug, and an end portion extending downward beyond a bottom surface of the body;

a spacer positioned under the body and having a top surface abutting against the bottom surface of the body and a base mounted on a circuit board, the base defining a plurality of receiving holes, a pair of recesses being formed in lateral faces of the base for engaging with the locking elements of the body; and a plurality of connection contacts being received in corresponding receiving holes of the spacer for engaging with the end portions of the signal terminals and interconnecting the signal terminals to the circuit board.

2. The audio jack electrical connector as claimed in claim 1, wherein each locking element comprises a locking arm and a locking tip formed at a free end of the locking arm and wherein a locking block is formed in each recess for locking with the corresponding locking arm.

3. The audio jack electrical connector as claimed in claim 1, wherein the length of the tubular receptacle projecting forwardly from the body is perpendicularly extended from a front surface of the body for engaging with the external plug for signal transmission.

4. The audio jack electrical connector as claimed in claim 1, wherein the signal terminals are received in a receiving portion formed on an inner surface of the tubular receptacle.

5. The audio jack electrical connector as claimed in claim 4, wherein the signal terminals comprise three contacting portions for electrically contacting the external plug.

6. The audio jack electrical connector as claimed in claim 1, wherein each connection contact is formed by stamping a metal plate and comprises a contacting portion and an insertion portion.

7. The audio jack electrical connector as claimed in claim 6, wherein the contacting portion comprises a fixing arm and a resilient arm formed on opposite edges thereof, a pair of barbs being formed on the fixing arm and the resilient arm respectively for securing the connection contact in the base.

8. The audio jack electrical connector as claimed in claim 7, wherein a folded plate is bent from the fixing arm and the resilient arm forms a convex portion for providing reliable electrical connection with the end portion of a corresponding signal terminal.

9. An audio jack electrical connector comprising:

a body defining a plurality of dispersed passageways;

a plurality of signal terminals received within the body, each of said terminals including an end section respectively extending downward through said passageways and out of a bottom surface of the body;

a spacer positioned under the body and including a top surface abutting against the bottom surface of the body and a base defining a plurality of dispersed receiving holes respectively in alignment with corresponding passageways;

a plurality of connection contacts received within the receiving holes, respectively, each of said connection contacts including a contact portion embedded within a corresponding receiving hole, and an insertion portion extending out of a bottom surface of the spacer; and means for fastening the body and spacer together; wherein the end portion of each of the terminals is aligned with a corresponding contact portion of each of the connection contacts and mechanically and electrically engages therewith in the corresponding receiving hole.

10. The connector as claimed in claim 9, wherein said body and said spacer are configured to have a similar width.

* * * * *